United States Patent
Agrawal et al.

(10) Patent No.: US 9,602,129 B2
(45) Date of Patent: *Mar. 21, 2017

(54) COMPACTLY STORING GEODETIC POINTS

(71) Applicant: International Business Machines Corporation, Armonk, NY (US)

(72) Inventors: Dakshi Agrawal, Monsey, NY (US); Raghu Kiran Ganti, Elmsford, NY (US); Mudhaker Srivatsa, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 210 days.

This patent is subject to a terminal disclaimer.

(21) Appl. No.: 13/839,985

(22) Filed: Mar. 15, 2013

(65) Prior Publication Data

US 2014/0279970 A1    Sep. 18, 2014

(51) Int. Cl.
  *G06F 17/30* (2006.01)
  *H03M 7/30* (2006.01)
  *H03M 7/40* (2006.01)

(52) U.S. Cl.
  CPC ..... *H03M 7/6011* (2013.01); *G06F 17/30241* (2013.01); *G06F 17/30312* (2013.01); *H03M 7/3088* (2013.01); *H03M 7/40* (2013.01)

(58) Field of Classification Search
  CPC ............... G06F 17/30333; G06F 17/30241
  See application file for complete search history.

(56) References Cited

U.S. PATENT DOCUMENTS

| 4,773,861 | A | 9/1988 | Dufour |
| 6,868,421 | B1 * | 3/2005 | Lin |
| 7,302,343 | B2 | 11/2007 | Beatty |
| 7,502,620 | B2 | 3/2009 | Morgan et al. |
| 7,668,386 | B2 | 2/2010 | Beatty |
| 8,050,689 | B2 | 11/2011 | Riise et al. |
| 8,229,766 | B2 | 7/2012 | Carttar et al. |

(Continued)

FOREIGN PATENT DOCUMENTS

| CN | 1808068 A | 7/2006 |
| CN | 102567439 A | 7/2012 |

(Continued)

OTHER PUBLICATIONS http://en.wikipedia.org/wiki/Datum_%28geodesy%29, Geodetic datum, accessed Mar. 1, 2013.

(Continued)

*Primary Examiner* — Mohammad S Rostami
(74) *Attorney, Agent, or Firm* — Scully, Scott, Murphy & Presser, P.C.; Mercedes L. Hobson, Esq.

(57) ABSTRACT

Mechanisms are provided for the compact storage of geographical geometries as a collection of points, where individual points are encoded as binary/ternary strings (with the property that points closer to each other share a longer binary/ternary prefix) and the geometry is encoded by compressing the binary/ternary representation of common-prefix points. Mechanisms are also provided for the representation of a geometry using a ternary string that allows efficient storage of arbitrary shapes (e.g., long line segments, oblong polygons) as opposed to binary representations that are more efficient when the geometries are square or nearly square shaped.

14 Claims, 7 Drawing Sheets

(56) References Cited

U.S. PATENT DOCUMENTS

| | | | |
|---|---|---|---|
| 8,983,953 B2* | 3/2015 | Oikarinen | 707/736 |
| 2003/0004995 A1 | 1/2003 | Novaes | |
| 2005/0063596 A1* | 3/2005 | Yomdin et al. | 382/232 |
| 2005/0131660 A1* | 6/2005 | Yadegar et al. | 703/2 |
| 2006/0095588 A1* | 5/2006 | Van Lunteren | 709/246 |
| 2008/0052488 A1* | 2/2008 | Fritz et al. | 711/216 |
| 2010/0085253 A1* | 4/2010 | Ferguson | G01S 19/04 342/357.41 |
| 2010/0106514 A1* | 4/2010 | Cox | G01C 21/20 705/1.1 |
| 2010/0205364 A1* | 8/2010 | Gazit | 711/108 |
| 2011/0257923 A1 | 10/2011 | Boulton | |
| 2012/0047181 A1* | 2/2012 | Baudel | 707/797 |
| 2012/0050294 A1* | 3/2012 | Kallay et al. | 345/442 |
| 2012/0166347 A1 | 6/2012 | Lacal | |
| 2012/0226889 A1 | 9/2012 | Merriman et al. | |
| 2012/0246400 A1* | 9/2012 | Bhadra et al. | 711/104 |
| 2012/0320248 A1* | 12/2012 | Igarashi | G01C 21/32 348/333.01 |
| 2013/0013661 A1* | 1/2013 | Inakoshi | G01C 21/20 708/442 |
| 2013/0054623 A1* | 2/2013 | Chang | G06F 17/30265 707/752 |
| 2014/0062776 A1* | 3/2014 | Ferguson | G01S 19/03 342/357.41 |
| 2014/0164390 A1 | 6/2014 | Hampapur et al. | |
| 2014/0244635 A1* | 8/2014 | Hu et al. | 707/724 |
| 2014/0278228 A1 | 9/2014 | Agrawal et al. | |

FOREIGN PATENT DOCUMENTS

| | | |
|---|---|---|
| CN | 102568035 A | 7/2012 |
| CN | 103714145 A | 4/2014 |
| EP | 1304652 A2 | 4/2003 |

OTHER PUBLICATIONS http://en.wikipedia.org/wiki/Geohash, Geohash, accessed Feb. 11, 2013.

"Circle of latitude", http://en.wikipedia.org/wiki/Circle_of_latitude, retrieved May 23, 2013; 9 pages.

Anonymous, "Dynamically report on dimension to multiple fact relationships with a single query", www.ip.com, IPCOM000232196D, Oct. 25, 2013, 6 pages.

Anonymous, "One-Dimensional Indexing for a Multi-Dimensional MDX Query", www.ip.com, IPCOM000226436D, Apr. 3, 2013, 7 pages.

Agrawal, et al., "Mapping Uncerain Geometries to Graticules", Provisional Application filed Mar. 15, 2013 (Expired), U.S. Appl. No. 61/794,397, now U.S. Appl. No. 13/937,500 filed Jul. 9, 2013, US Application Publication No. 2014/0278228 A1.

Yu et al., "A cache framework for geographical feature store", 20th International Conference on Geoinformatics, Hong Kong, Jun. 15-17, 2012, 4 pages.

\* cited by examiner

| HASH LENGTH | LAT BITS | LNG BITS | LAT ERROR | LNG ERROR | KM ERROR |
|---|---|---|---|---|---|
| 5 | 2 | 3 | ± 23 | ± 23 | ± 2500 |
| 10 | 5 | 5 | ± 2.8 | ± 5.6 | ± 630 |
| 15 | 7 | 8 | ± 0.70 | ± 0.7 | ± 78 |
| 20 | 10 | 10 | ± 0.087 | ± 0.18 | ± 20 |
| 25 | 12 | 13 | ± 0.022 | ± 0.022 | ± 2.4 |
| 30 | 15 | 15 | ± 0.0027 | ± 0.0055 | ± 0.61 |
| 32 | 16 | 16 | ± 0.00135 | ± 0.0027 | ± 0.305 |
| 40 | 20 | 20 | ± 0.000085 | ± 0.00017 | ± 0.019 |
| 64 | 32 | 32 | 2.07e-8 | 4.14e-8 | 9.4e-6 |
| 128 | 64 | 64 | 4.83e-18 | 9.66e-18 | 2.19e-15 |

FIG. 2

COMPACTLY STORING GEODETIC POINTS

BACKGROUND

The present disclosure relates generally to the field of compactly storing geodetic points.

Due to the rapid adaptation of smartsphones including GPS hardware, and other availability of geolocation techniques (e.g., WiFi/cell tower triangulation), it is now easy to gather spatiotemporal data on hundreds of millions of entities in real time and analyze the data to improve business processes and optimize services and infrastructure in a number of different industries. A key challenge in handling spatiotemporal data in real time is memory (e.g., RAM) requirements: experience shows that an application consuming data from a moderate size city can require several hundreds of gigabytes of RAM, making the overall analytic solution expensive.

Much of the memory consumption incurs in storing geospatial objects whose specification can consist of thousands of points on Earth. Conventional solutions encode a geodetic point using two double values (one for latitude and another for longitude) taking a total of 128 bits.

Popular open source Geographical Information Systems (GIS) packages typically do not use any compression of geometrical objects and typically require at least 128 bits to store a point.

Another example of a conventional process is text encoding of a point. The goal of this technique is to give a user friendly representation of a location on Earth. A text encoding may be used since street addresses are typically long (also, for many locations there is no address). A location can always be specified by its latitude and longitude, however latitudes and longitudes typically need to be specified to 6-8 decimal places (a total of 20+ digits to be entered including possibly minus signs, commas etc.) and there is a chance of switching between latitude and longitude, and hence the use of latitude and longitude is not considered very user friendly. For these reasons, various approaches to user friendly text encoding (e.g., suitable for URL specification) have been proposed.

The above-described text encoding has been customized for user friendly representation of locations. The above-described text encoding further converts bits to human readable strings (at the loss of flexibility in storage needed).

Another example of a conventional process is binary encoding of geometries. Several Geographical Information Systems (GIS) systems (e.g., INFORMIX) use binary encoding of geometries in their software implementations. These binary encodings allow different geometric objects to be passed back and forth as byte arrays regardless of what these geometries are (e.g., a point, a line segment, a polygon, etc.). It also provides flexibility to the software designer to later change how geometries are internally stored in the software. IBM's geospatial software INFORMIX spatial database and STOCKHOLM congestion pricing application developed on INFOSPHERE STREAMS take this approach. These conventional binary encoding approaches represent serialization/serialization of data as opposed to encodings for the purpose of compressing data. With these approaches, using a Huffman Coding to compress, for example, binary encoding of 2 km×2 km polygon is unlikely to yield any significant size benefit.

Another example of a conventional process is given by a geohash.

SUMMARY

In one example, the present disclosure relates to the field of compactly storing geodetic points.

In one embodiment a computer readable storage medium, tangibly embodying a program of instructions executable by the computer for storing a geometry represented by a plurality of geodetic points is provided, the program of instructions, when executing, performing the following steps: assigning, to each of the points, a respective string, wherein each string has characters that are selected from the group of binary characters and ternary characters, and wherein each string has a prefix portion and a non-prefix portion; reducing an amount of storage required to store the assigned strings, wherein the reducing comprises applying compression to the strings that exploits at least one common prefix that is shared by at least a first one of the strings and second one of the strings; and storing the compressed strings.

In another embodiment a computer-implemented system for storing a geometry represented by a plurality of geodetic points is provided, the system comprising: an input element configured to receive each of the points; an assigning element in operative communication with the input element configured to assign, to each of the points, a respective string, wherein each string has characters that are selected from the group of binary characters and ternary characters, and wherein each string has a prefix portion and a non-prefix portion; a reducing element in operative communication with the assigning element configured to reduce an amount of storage required to store the assigned strings, wherein the reduction comprises applying compression to the strings that exploits at least one common prefix that is shared by at least a first one of the strings and second one of the strings; and a storing element in operative communication with the reducing element configured to store the compressed strings.

In one example, all of the characters of each string are binary characters.

In another example, all of the characters of each string are ternary characters.

In another example, at least one of the strings has at least one binary character and at least one ternary character.

In another example, a length of the strings varies based upon an amount of precision to be provided by the strings.

In another example, each string comprises latitude information and longitude information.

In another example, the compression comprises one of: (a) LZW encoding; and (b) Huffman Coding.

BRIEF DESCRIPTION OF THE DRAWINGS

Various objects, features and advantages of the present invention will become apparent to one skilled in the art, in view of the following detailed description taken in combination with the attached drawings, in which:

FIG. 2 depicts a diagram showing a table of precision according to an embodiment.

DETAILED DESCRIPTION

Figure 1A:
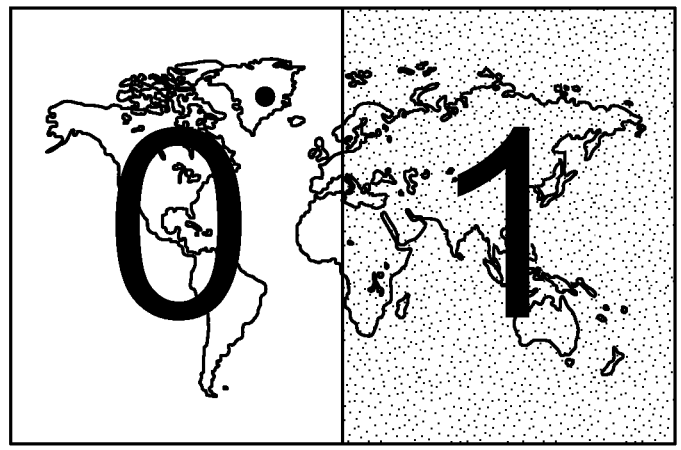
FIGS. 1A and 1B depict diagrams showing an example binary division of longitude and latitude ranges according to an embodiment.

In one example, one or more systems may provide for automatically compactly storing geodetic points. In another example, one or more methods may provide for automatically compactly storing geodetic points. In another example, one or more algorithms may provide for automatically compactly storing geodetic points.

For the purposes of this disclosure the term "geodetic point" is intended to refer to a point that identifies a position relative to the Earth (for example, a point at a particular location on the surface of the Earth). In this regard, there are various ways of representing a point on the earth—depending on the Datum (see, e.g., http://en.wikipedia.org/wiki/Datum_%28geodesy%29).

For the purposes of this disclosure the term "geohash" is intended to refer to a string encoding of a point on the Earth. The point on the Earth may be represented (among other possible coordinate systems) as a latitude/longitude or Easting/Northing—the choice of which is dependent on the coordinate system chosen to represent a point on the Earth. Geohash refers to an encoding of this point, where the geohash may be a binary string comprised of 0s and 1s corresponding to the point, or a string comprised of 0s, 1s, and a ternary character (such as X)—which is used to refer to a don't care character (0 or 1). A geohash can also be represented as a string encoding of the point, for example, one possible encoding is base-32, where every 5 binary characters are encoded as an ASCII character.

For the purposes of this disclosure the term "CAM" (or Content Addressable Memory) is intended to refer to hardware search engines (as opposed to algorithmic search engines) that significantly improve the search time (as little as one clock cycle). The term CAM may refer to either a binary-CAM where the address to be searched for is comprised of only 0s or 1s. It may also refer to a ternary-CAM where the address to be searched for is comprised of 0s, 1s, and a don't care marker (denoted typically by X), where X can match a 0 or a 1.

For the purposes of this disclosure the term "binary" is intended to refer to a representation of information (e.g., computer representation) using one of two possible values.

For the purposes of this disclosure the term "ternary" is intended to refer to a representation of information (e.g., computer representation) using one of three possible values.

For the purposes of this disclosure, an important observation is that the Earth is approximately only $4e+13$ micrometers around and that micrometer precision is typically more than sufficient for spatiotemporal applications. However, the dynamic range of a computer double-precision number format is from $-10e+308$ to $+10e+308$, so the data type typically used is larger than required for an application where more than micrometer precision will not be needed.

Thus, in various embodiments, compact and efficient storage is based on binary division of longitude and latitude ranges of the Earth to impose a successively refined grid on the Earth. Each box in this grid approximates a point on the Earth. An application can adaptively choose a grid size that is suitable for its purpose and then use an index in the grid to represent a point.

Figure 1B:
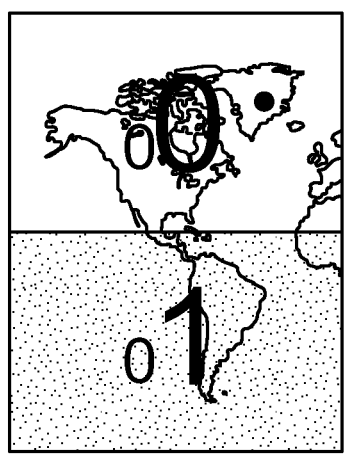

In this regard, reference is now made to FIGS. 1A and 1B. As mentioned above, binary division of longitude and latitude ranges is used. For example, assume that we wish to identify a point in Denmark. If we were to use only 1 bit to represent the point, we end up with "0" (see FIG. 1A), if we have two bits at our disposal, then we end up with a representation of "00" for the point (see FIG. 1B). At the depth of 2 bits, the grid size is rather large compared to the point of interest; however, it is easy to see that due to exponential decrease in size (each time a dimension is reduced by ½), the size of the grid shrinks rapidly and we get good approximation of the point by these bit strings. The table shown in FIG. 2 gives the size of the grid as a function of the number of bits (hash length is the combined number of latitude and longitude bits).

Still referring to FIG. 2, special attention could be paid to 32 bit, 64 bit and 128 bit representations of a point which have precision of roughly 305 meters, 10 millimeters, and 2 picometers if the area of interest is the whole Earth. Clearly, 10 millimeter is sufficient for many applications (e.g., traffic and transportation related applications) and using a 64 bit representation saves half the memory space (vs. 128 bits).

However, if the area of interest is smaller than the whole Earth, for example, New York City (about 22 km×4 km area), 32 bit storage that uses only one fourth of the original storage, will result in 33 cm precision—again, sufficient for many applications.

These examples illustrate how a variable amount of storage can be used for representing a point while still meeting application precision requirements. It should also be noted that compact representations of different geometries can be done using this concept as geometries are ultimately specified in terms of points (e.g., a polygon is specified by its boundary, which is specified by a sequence of line segments, and each line segment is specified by two points).

In one embodiment, the length of bit representation of latitude and longitude could be different for a given point. For example, latitude could be specified in 16 bits while longitude in only 8 bits, giving a 24 bit representation of a point—this could be sufficient, for example, for points near the pole where longitude lines converge and hence do not need to have as high a precision. In another example, the bit representations of the latitude and longitude could be interleaved to store a single bit array.

In another embodiment, once a compact way of representing a point is found, compact representations for other geometries can build on the disclosed compact representation of a point. For example, in order to specify a line segment, two points need to be specified. These points could be stored individually as two bit arrays or their bit representations can be concatenated to obtain a single bit array representation of a line segment, and so forth.

As described herein, this compact bit representation of point possesses a property that can be used to compact a large collection of points that are next to each other. For example, consider a lake 2 km×2 km whose boundary may be specified using four thousand points each roughly a few meters apart from its neighbors. From the table in FIG. 2, it is highly likely that the first 25 bits of the points used in specifying the boundary are same. In this case, a prefix compression scheme, such as Huffman Coding or LZW encoding may be used to further compress representation (e.g., binary representation) of points. Other examples are Shannon-Fano coding and Varicode. In general, Humman codes are a class of prefix compression schemes. There are several variants of Huffman codes—e.g., n-ary Huffman coding, Adaptive Huffman coding, Hu-Tucker coding, etc. In certain circumstances, LZW encoding is better than Huffman.

As described herein, various mechanisms provide for storing geographical geometries, wherein a geometry is represented by a collection of points and each point is represented using a geohash binary and/or ternary string of variable length (that is chosen based on application requirements), such that points that are closer to each other share a longer binary and/or ternary prefix. Compression (e.g., Huffman Coding or LZW encoding) is applied that exploits common prefixes in the binary and/or ternary strings to compactly represent and store the geometry (in one specific example, the geometries may be stored efficiently on a CAM (e.g., binary-CAM, ternary-CAM).

Figure 3:
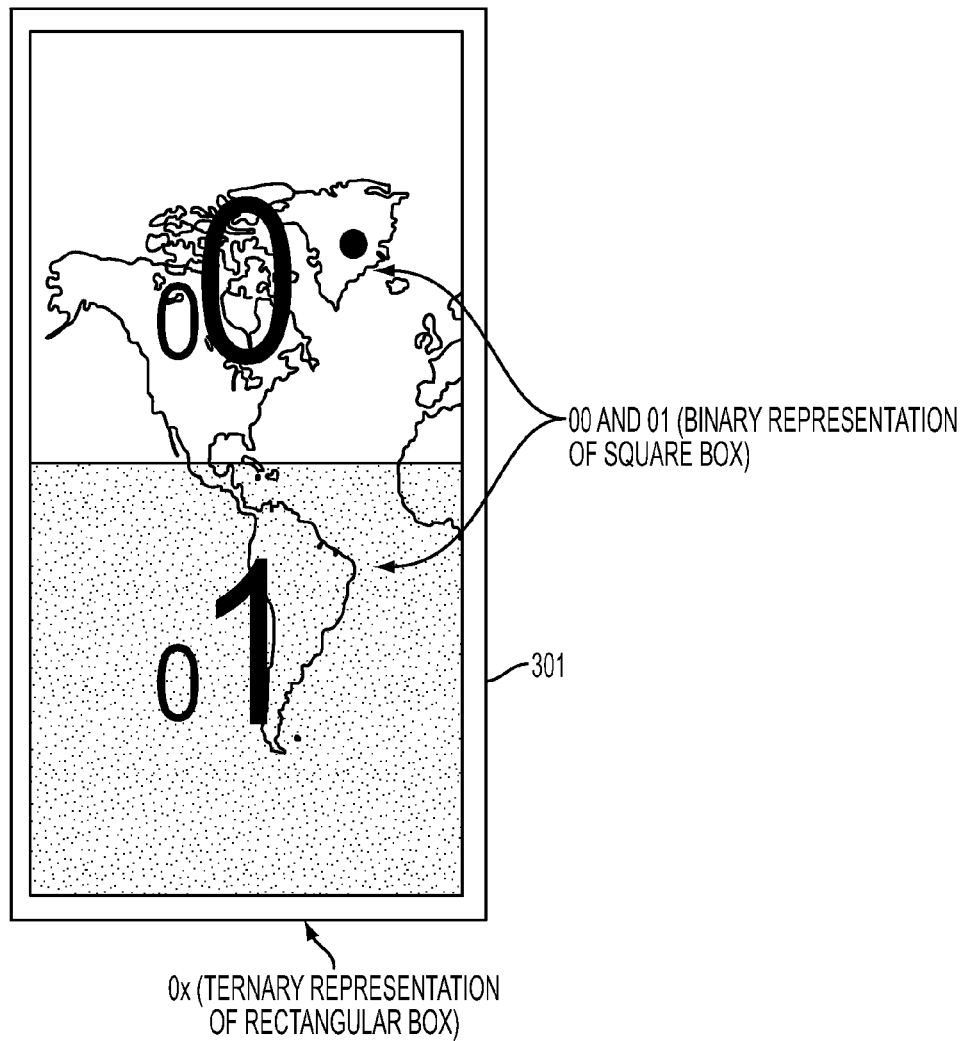
FIG. 3 depicts a diagram showing an example binary and ternary representation according to an embodiment.

As described herein, mechanisms are provided for handling ternary representations of geometries. For example, oblong geometries (e.g., oblong polygons, oblong line-segments) that cannot be represented in purely binary form (e.g., the rectangular box 301 as shown in FIG. 3) may need the introduction of a ternary (e.g., don't care character—x) symbol for representing/encoding a geometry efficiently. In this context, a don't care character (usually represented as X) implies that the character can be interpreted as either a 0 or 1. For example, if the character were an X at position i, then if we compare it with a geohash that has a 0 in position i, the two provided geohashes will be equal at that position. In other words, an X can be treated as a 0 or a 1

Figure 4:
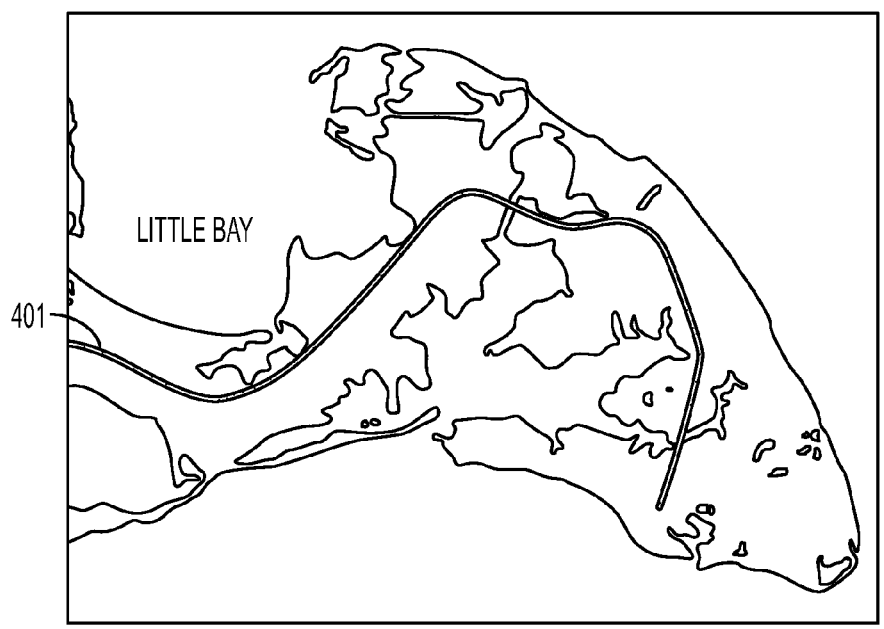
FIG. 4 depicts a diagram showing an example oblong line segment in the form of a road according to an embodiment.

In various examples, many geometries such as polygons representing counties or line segments representing roads are naturally oblong geometries (see FIG. 4, showing an oblong line segment 401 in the form of a road).

Figure 5:
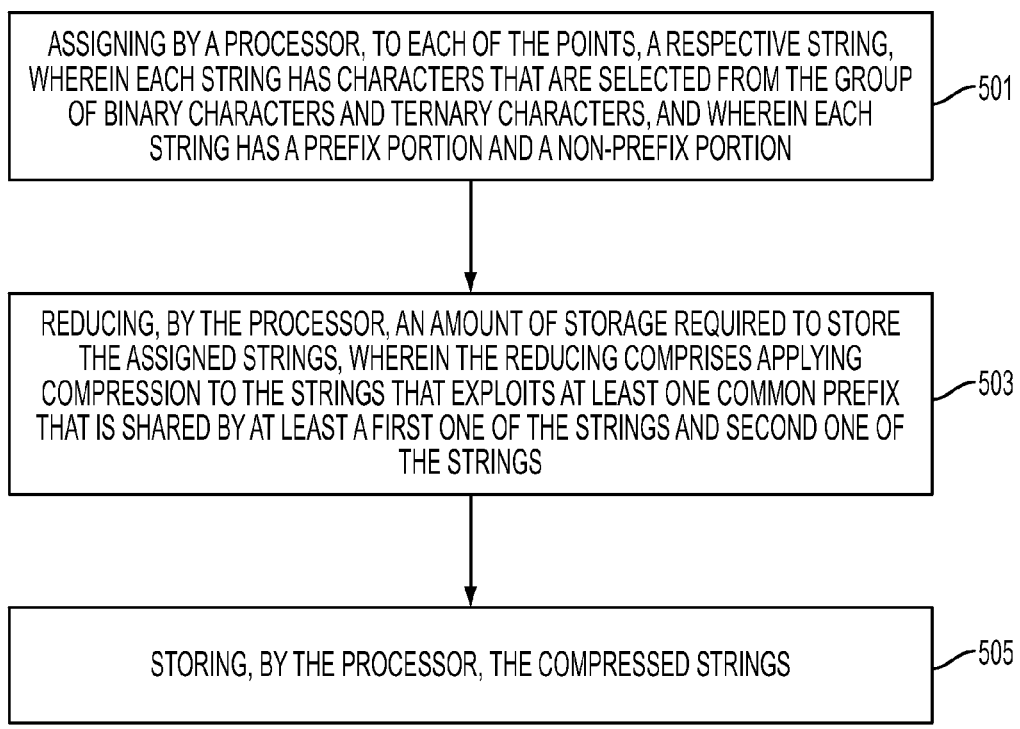
FIG. 5 depicts a flowchart of a method according to an embodiment.

Referring now to FIG. 5, a method for storing a geometry represented by a plurality of geodetic points is shown. As seen in this FIG. 5, the method of this embodiment comprises: at 501—assigning by a processor, to each of the points, a respective string, wherein each string has characters that are selected from the group of binary characters and ternary characters, and wherein each string has a prefix portion and a non-prefix portion; at 503—reducing, by the processor, an amount of storage required to store the assigned strings, wherein the reducing comprises applying compression to the strings that exploits at least one common prefix that is shared by at least a first one of the strings and second one of the strings; and at 505—storing, by the processor, the compressed strings.

One example of how the characters may be applied to strings (that is, applying characters to a point) can be found at http://en.wikipedia.org/wiki/Geohash. The character set used in this article is alphanumeric. One can encode these alphanumeric characters as binary strings, for example, using their ASCII values.

In one example, any steps described above may be carried out in any appropriate desired order.

Figure 6:
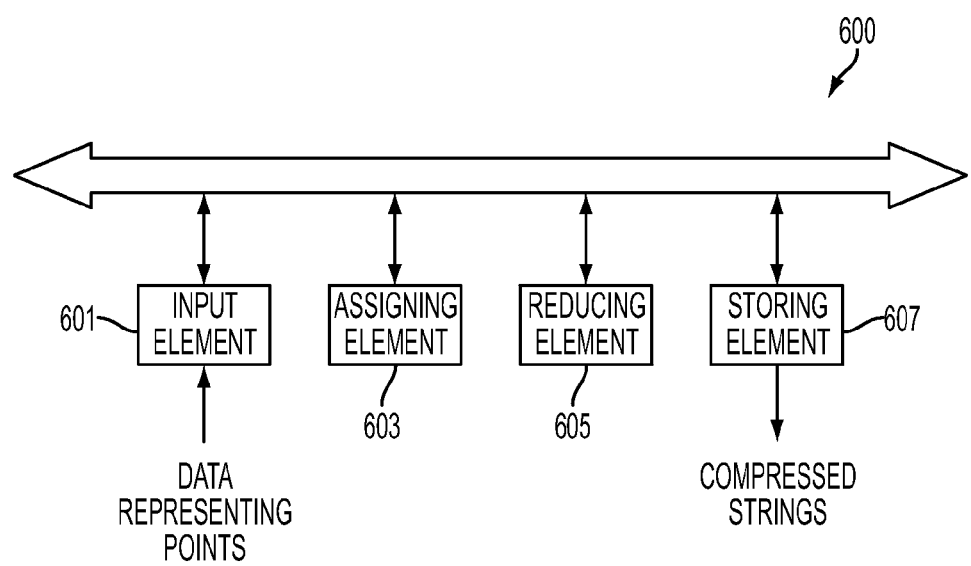
FIG. 6 depicts a block diagram of a system according to an embodiment.

Referring now to FIG. 6, in another embodiment, a system 600 for storing a geometry represented by a plurality of geodetic points is provided. This system may include the following elements: an input element 601 configured to receive each of the points; an assigning element 603 in operative communication with the input element configured to assign, to each of the points, a respective string, wherein each string has characters that are selected from the group of binary characters and ternary characters, and wherein each string has a prefix portion and a non-prefix portion; a reducing element 605 in operative communication with the assigning element configured to reduce an amount of storage required to store the assigned strings, wherein the reduction comprises applying compression to the strings that exploits at least one common prefix that is shared by at least a first one of the strings and second one of the strings; and a storing element 607 in operative communication with the reducing element configured to store the compressed strings.

In one example, communication between and among the various components of FIG. 6 may be bi-directional. In another example, the communication may be carried out via the Internet, an intranet, a local area network, a wide area network and/or any other desired communication channel(s). In another example, each of the components may be operatively connected to each of the other components. In another example, some or all of these components may be implemented in a computer system of the type shown in FIG. 7.

Figure 7:
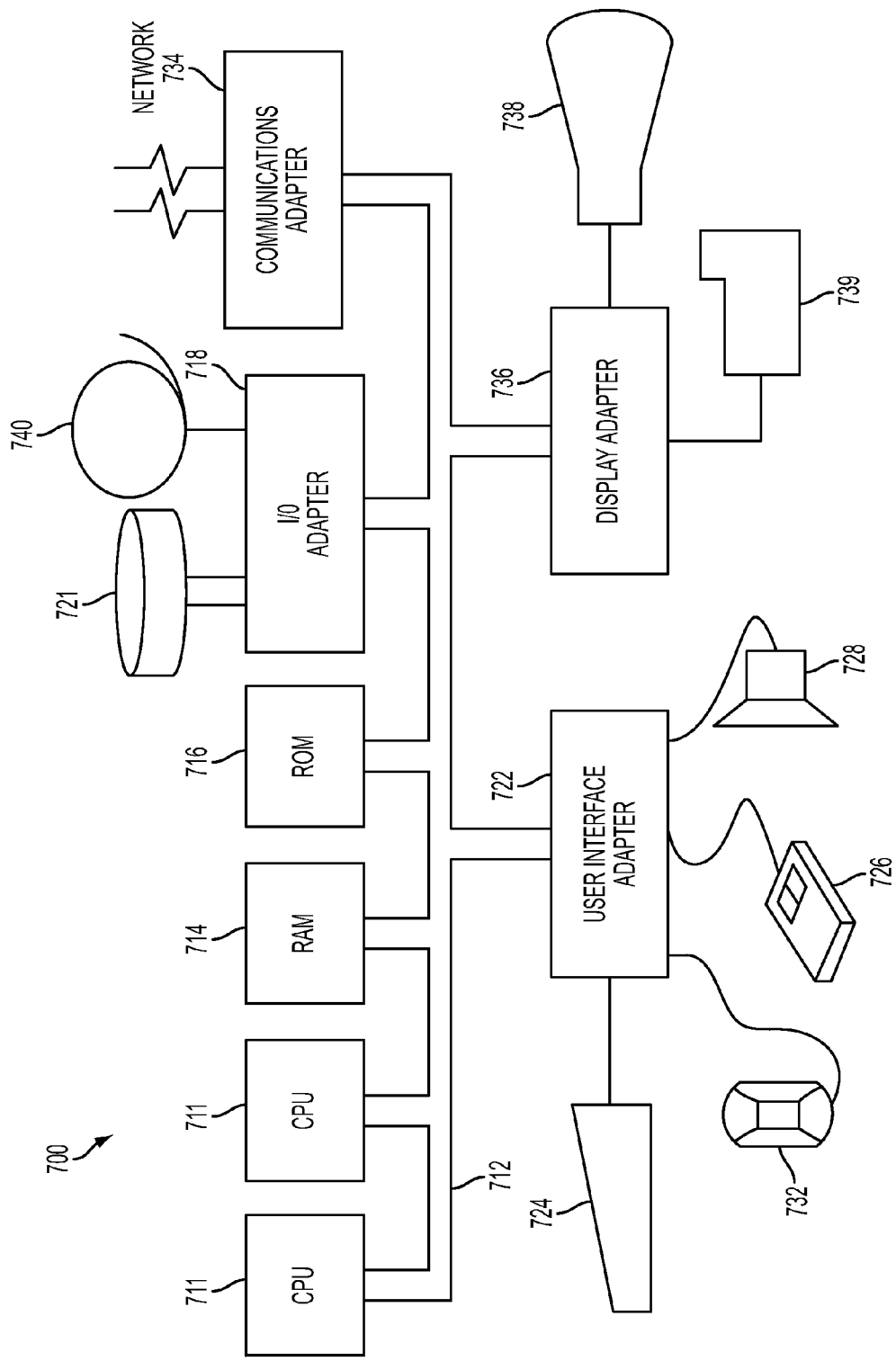
FIG. 7 depicts a block diagram of a system according to an embodiment.

Referring now to FIG. 7, this figure shows a hardware configuration of computing system 800 according to an embodiment of the present invention. As seen, this hardware configuration has at least one processor or central processing unit (CPU) 711. The CPUs 711 are interconnected via a system bus 712 to a random access memory (RAM) 714, read-only memory (ROM) 716, input/output (I/O) adapter 718 (for connecting peripheral devices such as disk units 721 and tape drives 740 to the bus 712), user interface adapter 722 (for connecting a keyboard 724, mouse 726, speaker 728, microphone 732, and/or other user interface device to the bus 712), a communications adapter 734 for connecting the system 700 to a data processing network, the Internet, an Intranet, a local area network (LAN), etc., and a display adapter 736 for connecting the bus 712 to a display device 738 and/or printer 739 (e.g., a digital printer or the like).

As described herein, various mechanisms provide for a shared binary and/or ternary prefix (that is, shared for points that are closer to each other than other points) that may be exploited by a compression algorithm. In one specific example, this may be important when dealing with large quantities (e.g., millions) of geometries that are in physical proximity to each other. For example, in one model, Stockholm, Sweden has approximately 5 M road segments—the geohash for these road segments will share a common prefix of length 26 bits (assuming use of a 64 bit geohash (i.e., 9.4 mm precision)). The result in this example is thus a storage size savings of at least 40.625% (i.e., $26/64$).

As described herein, various mechanisms provide for the efficient storage and/or encoding and/or compression of an arbitrary geometry as a collection of points (using binary and/or ternary strings) on CAMs (e.g., binary-CAM, ternary-CAM).

As described herein, various mechanisms provide for storage and/or encoding and/or compression of an arbitrary geometry in a compact form.

As described herein, mechanisms are provided to store a point in a dynamic amount of memory that can be adopted depending on the application.

As described herein, various embodiments may be provided in the context of web technology (e.g., wireless).

As described herein, various embodiments may be provided in the context of: (a) telecommunications networks; and/or (b) wireless/mobile networking.

As described herein, various mechanisms may be provided to use a compact representation of a point in GIS software.

As described herein, various mechanisms may be provided to internally store (e.g., in RAM) one or more geometries.

As described herein, mechanisms are provided for: (a) saving storage space by compressing data; (b) keeping information at the level of bits—allowing flexibility at the bit level; and/or (c) storage of arbitrary geometries (e.g., a point, a line segment, a polygon, etc.).

In one embodiment a method for storing a geometry represented by a plurality of geodetic points is provided, the method comprising: assigning by a processor, to each of the points, a respective string, wherein each string has characters that are selected from the group of binary characters and ternary characters, and wherein each string has a prefix portion and a non-prefix portion; reducing, by the processor, an amount of storage required to store the assigned strings, wherein the reducing comprises applying compression to the strings that exploits at least one common prefix that is shared by at least a first one of the strings and second one of the strings; and storing, by the processor, the compressed strings.

In one example, all of the characters of each string are binary characters.

In another example, all of the characters of each string are ternary characters.

In another example, at least one of the strings has at least one binary character and at least one ternary character.

In another example, a length of the strings varies based upon an amount of precision to be provided by the strings.

In another example, each string comprises latitude information and longitude information.

In another example, the compression comprises one of: (a) LZW encoding; and (b) Huffman Coding.

In another embodiment a computer readable storage medium, tangibly embodying a program of instructions executable by the computer for storing a geometry represented by a plurality of geodetic points is provided, the program of instructions, when executing, performing the following steps: assigning, to each of the points, a respective string, wherein each string has characters that are selected from the group of binary characters and ternary characters, and wherein each string has a prefix portion and a non-prefix portion; reducing an amount of storage required to store the assigned strings, wherein the reducing comprises applying compression to the strings that exploits at least one common prefix that is shared by at least a first one of the strings and second one of the strings; and storing the compressed strings.

In one example, all of the characters of each string are binary characters.

In another example, all of the characters of each string are ternary characters.

In another example, at least one of the strings has at least one binary character and at least one ternary character.

In another example, a length of the strings varies based upon an amount of precision to be provided by the strings.

In another example, each string comprises latitude information and longitude information.

In another example, the compression comprises one of: (a) LZW encoding; and (b) Huffman Coding.

In another embodiment a computer-implemented system for storing a geometry represented by a plurality of geodetic points is provided, the system comprising: an input element configured to receive each of the points; an assigning element in operative communication with the input element configured to assign, to each of the points, a respective string, wherein each string has characters that are selected from the group of binary characters and ternary characters, and wherein each string has a prefix portion and a non-prefix portion; a reducing element in operative communication with the assigning element configured to reduce an amount of storage required to store the assigned strings, wherein the reduction comprises applying compression to the strings that exploits at least one common prefix that is shared by at least a first one of the strings and second one of the strings; and a storing element in operative communication with the reducing element configured to store the compressed strings.

In one example, all of the characters of each string are binary characters.

In another example, all of the characters of each string are ternary characters.

In another example, at least one of the strings has at least one binary character and at least one ternary character.

In another example, a length of the strings varies based upon an amount of precision to be provided by the strings.

In another example, each string comprises latitude information and longitude information.

In another example, the compression comprises one of: (a) LZW encoding; and (b) Huffman Coding.

In other examples, any steps described herein may be carried out in any appropriate desired order.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any programming language or any combination of one or more programming languages, including an object oriented programming language such as Java, Smalltalk, C++ or the like or a procedural programming language, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention may be described herein with reference to flowchart illustrations and/or block diagrams of methods, systems and/or computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus or other devices provide processes for implementing the functions/acts specified in the flowchart and/or block diagram block or blocks.

The flowcharts and block diagrams in the figures illustrate the architecture, functionality, and operation of possible implementations of systems, methods and computer program products according to various embodiments of the present invention. In this regard, each block in the flowcharts or block diagrams may represent a module, segment, or portion of code, which comprises one or more executable instructions for implementing the specified logical function(s). It should also be noted that, in some implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

It is noted that the foregoing has outlined some of the objects and embodiments of the present invention. This invention may be used for many applications. Thus, although the description is made for particular arrangements and methods, the intent and concept of the invention is suitable and applicable to other arrangements and applications. It will be clear to those skilled in the art that modifications to the disclosed embodiments can be effected without departing from the spirit and scope of the invention. The described embodiments ought to be construed to be merely illustrative of some of the features and applications of the invention. Other beneficial results can be realized by applying the disclosed invention in a different manner or modifying the invention in ways known to those familiar with the art. In addition, all of the examples disclosed herein are intended to be illustrative, and not restrictive.

What is claimed is:

1. A computer readable storage device, tangibly embodying a program of instructions executable by the computer for storing a geometry represented by a plurality of geodetic points, the program of instructions, when executing, performing the following steps:

assigning, to each of the plurality of points of the geometry, a respective string, wherein each string has characters that are selected from the group of binary characters and ternary characters, and wherein each string has a prefix portion and a non-prefix portion;

reducing an amount of storage required to store the assigned strings associated with the geometry, wherein the reducing comprises applying compression to the strings associated with the geometry that exploits at least one common prefix that is shared by at least a first one of the strings associated with the geometry and a second one of the strings associated with the geometry; and storing the compressed strings associated with the geometry;

wherein the geometry comprises at least one of a line segment and a polygon;

wherein a length of the strings varies based upon an amount of geographic precision to be provided by the strings; and wherein a length of bit representation in the strings of latitude differs from a length of bit representation in the strings of longitude.

2. The computer readable storage device of claim 1, wherein all of the characters of each string are binary characters.

3. The computer readable storage device of claim 1, wherein all of the characters of each string are ternary characters.

4. The computer readable storage device of claim 1, wherein at least one of the strings has at least one binary character and at least one ternary character.

5. The computer readable storage device of claim 1, wherein the compression comprises one of: (a) LZW encoding; and (b) Huffman Coding.

6. A computer-implemented system for storing a geometry represented by a plurality of geodetic points, the system comprising:

a processor; and a memory storing computer readable instructions that, when executed by the processor, implement:

an input element configured to receive each of the plurality of points of the geometry;

an assigning element in operative communication with the input element configured to assign, to each of the plurality of points of the geometry, a respective string, wherein each string has characters that are selected from the group of binary characters and ternary characters, and wherein each string has a prefix portion and a non-prefix portion;

a reducing element in operative communication with the assigning element configured to reduce an amount of storage required to store the assigned strings associated with the geometry, wherein the reduction comprises applying compression to the strings associated with the geometry that exploits at least one common prefix that is shared by at least a first one of the strings associated with the geometry and a second one of the strings of the geometry; and a storing element in operative communication with the reducing element configured to store the compressed strings associated with the geometry;

wherein the geometry comprises at least one of a line segment and a polygon;

wherein a length of the strings varies based upon an amount of geographic precision to be provided by the strings; and wherein a length of bit representation in the strings of latitude differs from a length of bit representation in the strings of longitude.

7. The system of claim 6, wherein all of the characters of each string are binary characters.

8. The system of claim 6, wherein all of the characters of each string are ternary characters.

9. The system of claim 6, wherein at least one of the strings has at least one binary character and at least one ternary character.

10. The system of claim 6, wherein the compression comprises one of: (a) LZW encoding; and (b) Huffman Coding.

11. The computer readable storage device of claim 1, wherein the geometry comprises an oblong geometry.

12. The system of claim 6, wherein the geometry comprises an oblong geometry.

13. The computer readable storage device of claim 1, wherein the length of bit representation in the strings of latitude is larger than the length of bit representation in the strings of longitude such that less precision is provided for the longitude than for the latitude.

14. The system of claim 6, wherein the length of bit representation in the strings of latitude is larger than the length of bit representation in the strings of longitude such that less precision is provided for the longitude than for the latitude.

* * * * *